United States Patent
Nakano et al.

(10) Patent No.: US 11,569,044 B2
(45) Date of Patent: Jan. 31, 2023

(54) SOLAR BATTERY UNIT AND WIRELESS TRANSMITTER INCLUDING SOLAR BATTERY UNIT

(71) Applicant: SHARP KABUSHIKI KAISHA, Sakai (JP)

(72) Inventors: Masayuki Nakano, Sakai (JP); Satoshi Shimizu, Sakai (JP); Masato Sasaki, Sakai (JP); Yuki Watanabe, Sakai (JP); Tomohisa Yoshie, Sakai (JP); Tetsuya Ikemoto, Sakai (JP); Daisuke Toyoshima, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 17/260,457

(22) PCT Filed: Jul. 1, 2019

(86) PCT No.: PCT/JP2019/026140
§ 371 (c)(1),
(2) Date: Jan. 14, 2021

(87) PCT Pub. No.: WO2020/021982
PCT Pub. Date: Jan. 30, 2020

(65) Prior Publication Data
US 2021/0304971 A1    Sep. 30, 2021

(30) Foreign Application Priority Data

Jul. 24, 2018  (JP) .............................. JP2018-138848
Jul. 24, 2018  (JP) .............................. JP2018-138849
Jul. 24, 2018  (JP) .............................. JP2018-138850

(51) Int. Cl.
| H01G 9/20 | (2006.01) |
| H02S 40/34 | (2014.01) |
| H05B 47/19 | (2020.01) |
| H01Q 1/22 | (2006.01) |

(52) U.S. Cl.
CPC ............. *H01G 9/2081* (2013.01); *H01Q 1/22* (2013.01); *H02S 40/34* (2014.12); *H05B 47/19* (2020.01)

(58) Field of Classification Search
CPC ........ H01G 9/2081; H02S 40/34; H05B 47/19
See application file for complete search history.

(56) References Cited

U.S. PATENT DOCUMENTS

| 2005/0195689 A1 | 9/2005 | Oguchi | |
| 2008/0013409 A1* | 1/2008 | Bland | .............. G04B 45/02 368/223 |

(Continued)

FOREIGN PATENT DOCUMENTS

| JP | 2006-145558 A | 6/2006 |
| JP | 2011-163913 A | 8/2011 |

(Continued)

*Primary Examiner* — Tae-Sik Kang
(74) *Attorney, Agent, or Firm* — ScienBiziP, P.C.

(57) ABSTRACT

A solar battery unit (100) is provided that includes: a substrate (120); a solar battery (110) attached to a back face of the substrate (120); and a communications module (130) attached to the substrate (120). The communications module (130) includes an antenna (132) disposed so as not to overlap solar cells (115) in the solar battery (110) in a front view.

20 Claims, 13 Drawing Sheets

(56) References Cited

U.S. PATENT DOCUMENTS

| | | | |
|---|---|---|---|
| 2012/0015472 A1* | 1/2012 | Hayashi | H01L 31/1884 257/E31.126 |
| 2013/0133712 A1* | 5/2013 | Feldman-Peabody | H01L 31/073 136/244 |
| 2015/0243448 A1 | 8/2015 | Okada et al. | |
| 2017/0040681 A1* | 2/2017 | Fujisawa | H01Q 9/0407 |
| 2018/0330892 A1 | 11/2018 | Nishino et al. | |
| 2019/0005367 A1 | 1/2019 | Yamada et al. | |

FOREIGN PATENT DOCUMENTS

| | | |
|---|---|---|
| JP | 2014-160957 A | 9/2014 |
| JP | 2016-167604 A | 9/2016 |
| JP | 2017-037057 A | 2/2017 |
| JP | 2017-098358 A | 6/2017 |
| WO | 2017/013940 A1 | 1/2017 |

\* cited by examiner

FIG.7 (a) (b)
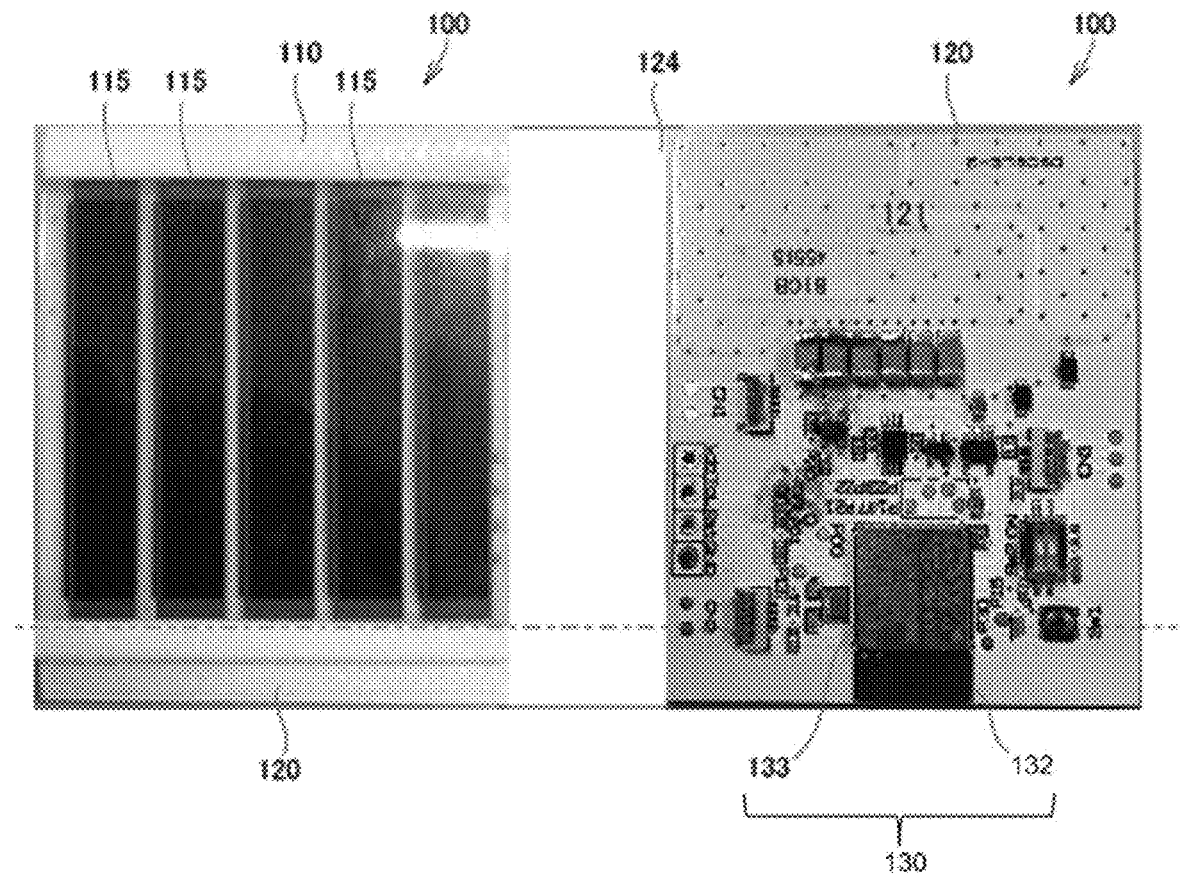
FIG.8
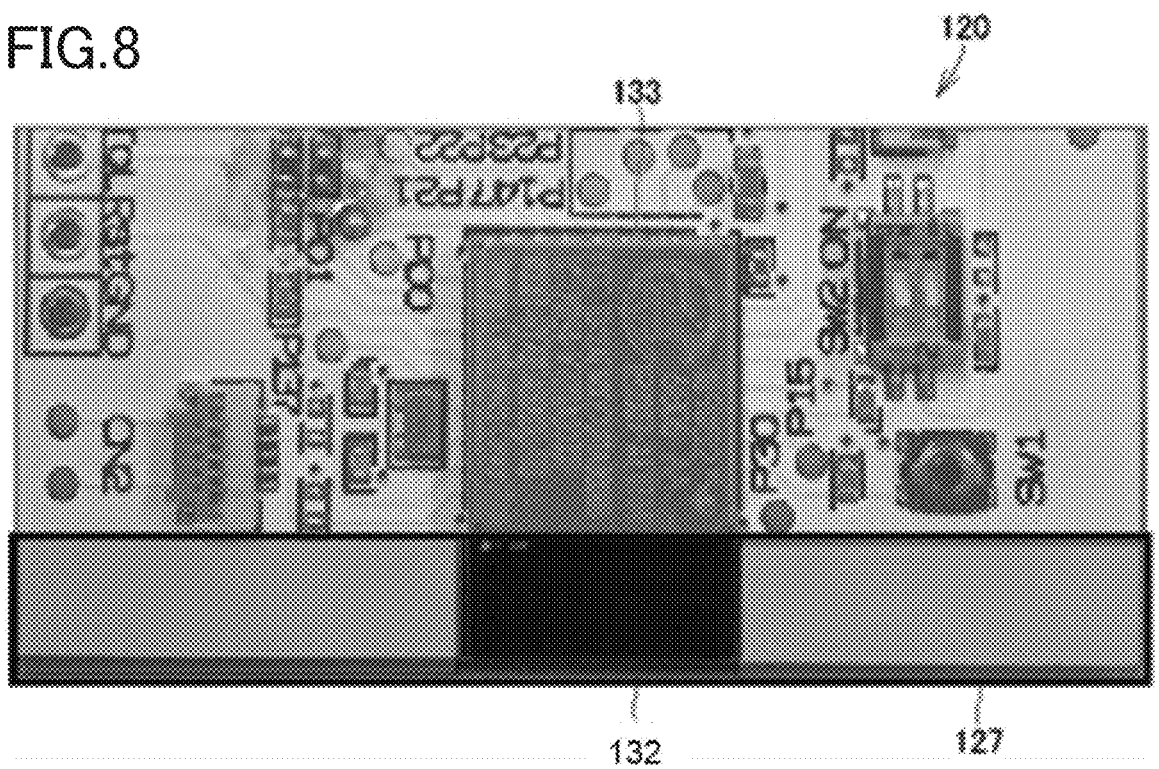

SOLAR BATTERY UNIT AND WIRELESS TRANSMITTER INCLUDING SOLAR BATTERY UNIT

TECHNICAL FIELD

The present disclosure relates to technology for solar battery units including a solar battery.

BACKGROUND ART

Solar battery units have been known that include a solar battery and a communications antenna among others. As an example, International Japanese Patent Application Publication, Tokukou, 2017/013940 (Patent Literature 1) discloses a communications device. Patent Literature 1 provides a communications device including: a solar battery having a light-receiving face where emission light is received; a power storage device disposed on the opposite face from the light-receiving face; and a circuit substrate disposed on the opposite face of the power storage device from another face thereof facing the solar battery, the circuit substrate including a communications antenna.

CITATION LIST

Patent Literature

Patent Literature 1: International Japanese Patent Application Publication, Tokukou, 2017/013940

SUMMARY OF INVENTION

Technical Problem

The present disclosure has an object to provide a solar battery unit that restrains a solar battery from attenuating radio waves transmitted from a communications antenna.

Solution to Problem

The present disclosure, in an aspect thereof, provides a solar battery unit including: a substrate; a solar battery attached to a front face of the substrate; and an antenna attached to a back face of the substrate, the antenna being supplied with electric power from the solar battery, wherein the antenna is disposed so as not to overlap a solar cell in the solar battery in a front view.

Advantageous Effects of Invention

As described in the foregoing, the present disclosure provides a solar battery unit that restrains a solar battery from attenuating radio waves transmitted from a communications antenna.

BRIEF DESCRIPTION OF DRAWINGS

FIG. 7 is a photograph showing the positional relationship between solar cells 115 in the solar battery 110 and the communications module 130, both in the solar battery unit 100 in accordance with the first embodiment.

FIG. 8 is a photograph of the communications module 130 and the front face of the substrate 120 in accordance with the first embodiment.

DESCRIPTION OF EMBODIMENTS

Figure 1:
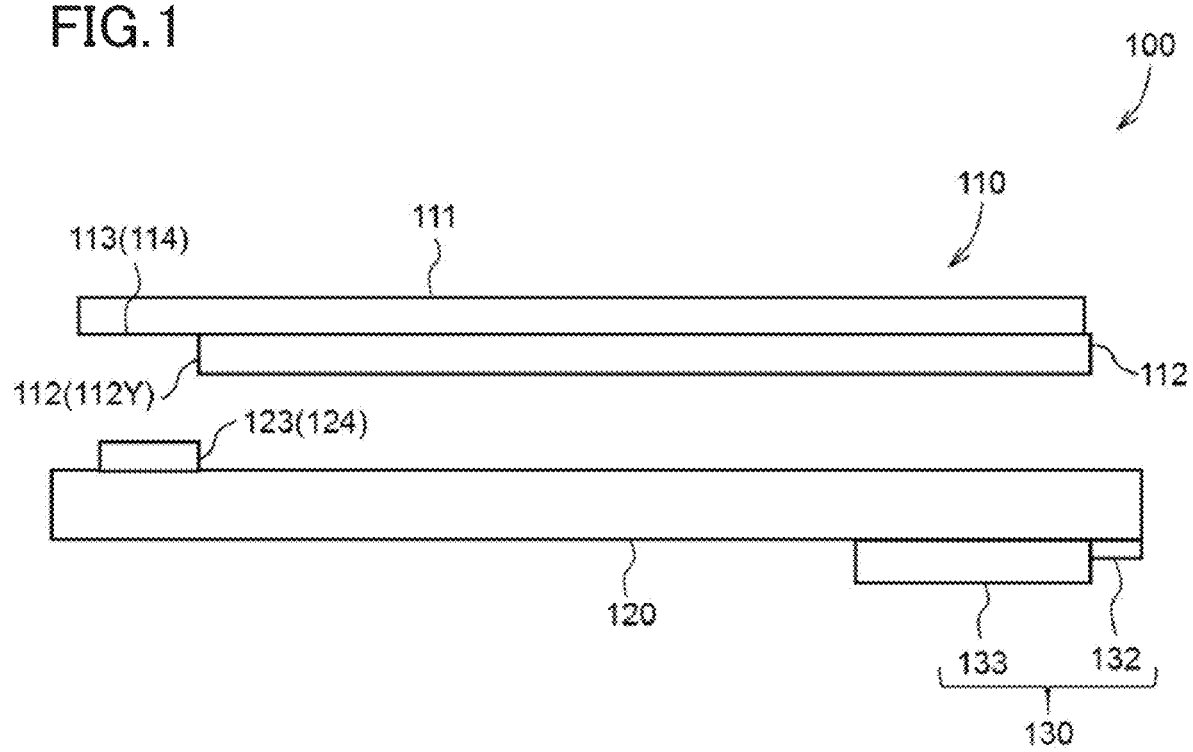
FIG. 1 is a cross-sectional side view of the overall structure of a solar battery unit 100 in accordance with a first embodiment.

The following will describe embodiments of the present disclosure with reference to drawings. Identical members are denoted by the same reference numerals throughout the following description. Such members are given the same names and have the same functionality, and description thereof is therefore not repeated.

First Embodiment

Overall Structure of Solar Battery Unit 100

Figure 2:
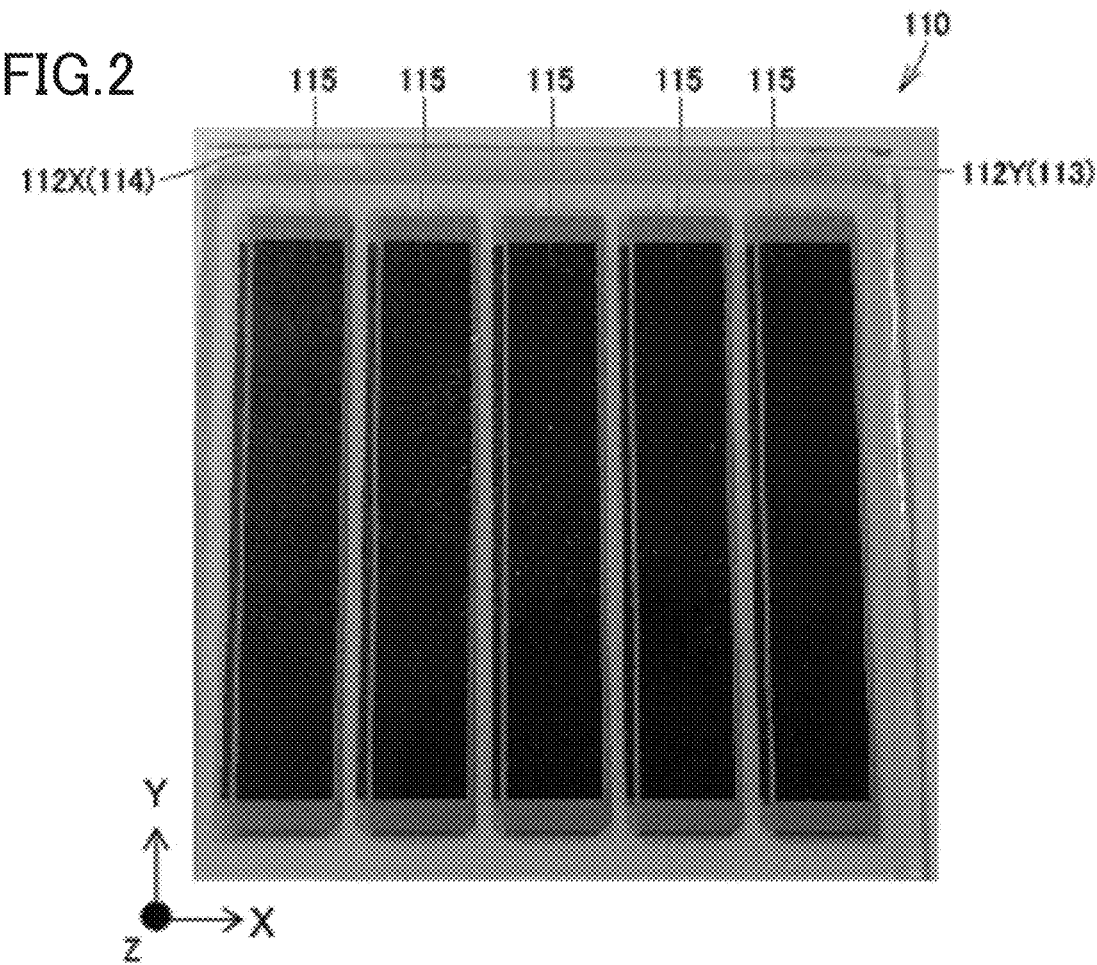
FIG. 2 is a photograph of a light-receiving face side of a solar battery 110 in the solar battery unit 100 in accordance with the first embodiment.
Figure 3:
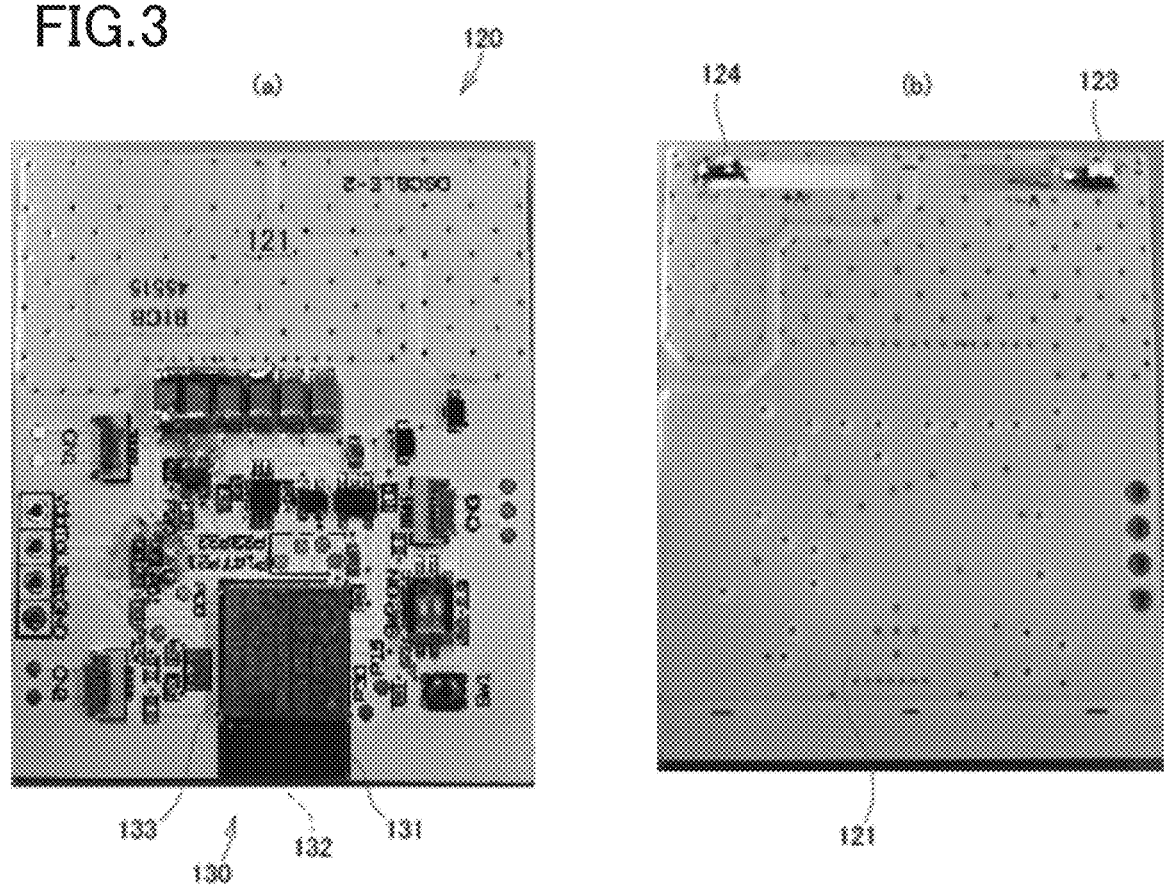
FIG. 3(a) is a photograph of the back face of a substrate 120 in accordance with the first embodiment.
FIG. 3(b) is a photograph of the front face (i.e., a light-receiving face) of the substrate 120 of the solar battery unit 100 in accordance with the first embodiment.

A description is now given of the overall structure of a solar battery unit 100 in accordance with the present embodiment. As shown in FIGS. 1 to 3, the solar battery unit 100 in accordance with the present embodiment primarily includes a solar battery 110, a substrate 120, and a communications module 130 and may further include a capacitor for storing the electric power generated by the solar battery 110 and a control IC and other electronic components. The solar battery 110 is disposed on the front face of the substrate 120. The communications module 130 is disposed on the back face of the substrate 120.

The solar battery unit 100 in accordance with the present embodiment enables the communications module 130, including a communications device 133 and an antenna 132, to perform various communications by using the electric power generated by the solar battery 110. For instance, when the solar battery 110 is a set of dye-sensitized solar cells, and the communications module 130 is a beacon, the solar battery 110 can generate electric power from the light emitted by indoor lights, and the communications module 130 can regularly emit radio beacons, so that, for example, a mobile phone or like terminal can obtain an accurate location thereof upon receiving the radio beacons and a server can obtain an accurate location of the terminal upon receiving the radio beacons.

More specifically, the solar battery 110 includes a first glass substrate 111 and a second glass substrate 112, the first glass substrate 111 serving as a light-receiving face. There is provided a transparent conductive film on a face of the first glass substrate 111 facing the second glass substrate 112. Notches 112X and 112Y are formed at the ends of the second glass substrate 112 in the Y direction and the ends thereof in the X direction in FIG. 2. The notches 112Y and 112X in the transparent conductive film on the first glass substrate 111 serve as a negative output terminal 113 (first output terminal) and as a positive output terminal 114 (second output terminal) respectively. In other words, the negative output terminal 113 and the positive output terminal 114 are provided on the back face of the solar battery 110, that is, on a face of the solar battery 110 facing the substrate 120.

The first glass substrate 111 may be made of any material so long as the first glass substrate 111 is transparent. The first glass substrate 111 may be made of a film instead of glass. The second glass substrate 112 may be replaced by a non-transparent substrate.

The solar battery 110 is a set of monolithic dye-sensitized solar cells in the present embodiment. Two or more longitudinally elongated solar cells 115 are disposed side by side when the light-receiving face side of the solar battery 110 is viewed from the front, as shown in FIG. 2. More specifically, the solar battery 110 in accordance with the present embodiment is a set of five series-connected solar cells 115, each capable of generating 0.6 volts, so that the solar battery 110 has a total output of 3 volts.

Referring to FIG. 3(b), the front face of the substrate 120 has an area 210 for mounting the solar battery 110. A negative input terminal 123 (first input terminal) is positioned facing the negative output terminal 113 of the solar battery 110, whereas a positive input terminal 124 (second input terminal) is positioned facing the positive output terminal 114 of the solar battery 110.

Particularly, in the present embodiment, there is provided a flat area 121 on the backside of the substrate 120, opposite and away from the communications module 130 as shown in FIG. 3(a). No electronic and other components are mounted in the flat area 121. A portion of the backside of the substrate 120 close to the negative input terminal 123 or the positive input terminal 124, that is, a portion distanced from the communications module 130, is formed flat in the present embodiment.

The flat area 121 is preferably an expanse covering at least one third of the entire substrate 120 and including an end of the substrate 120. In other words, letting A represent the distance in millimeters from an end of the communications module 130 where the antenna 132 is located to the opposite end, the flat area 121 preferably covers up to at least a third of the distance A from the opposite end.

Figure 4:
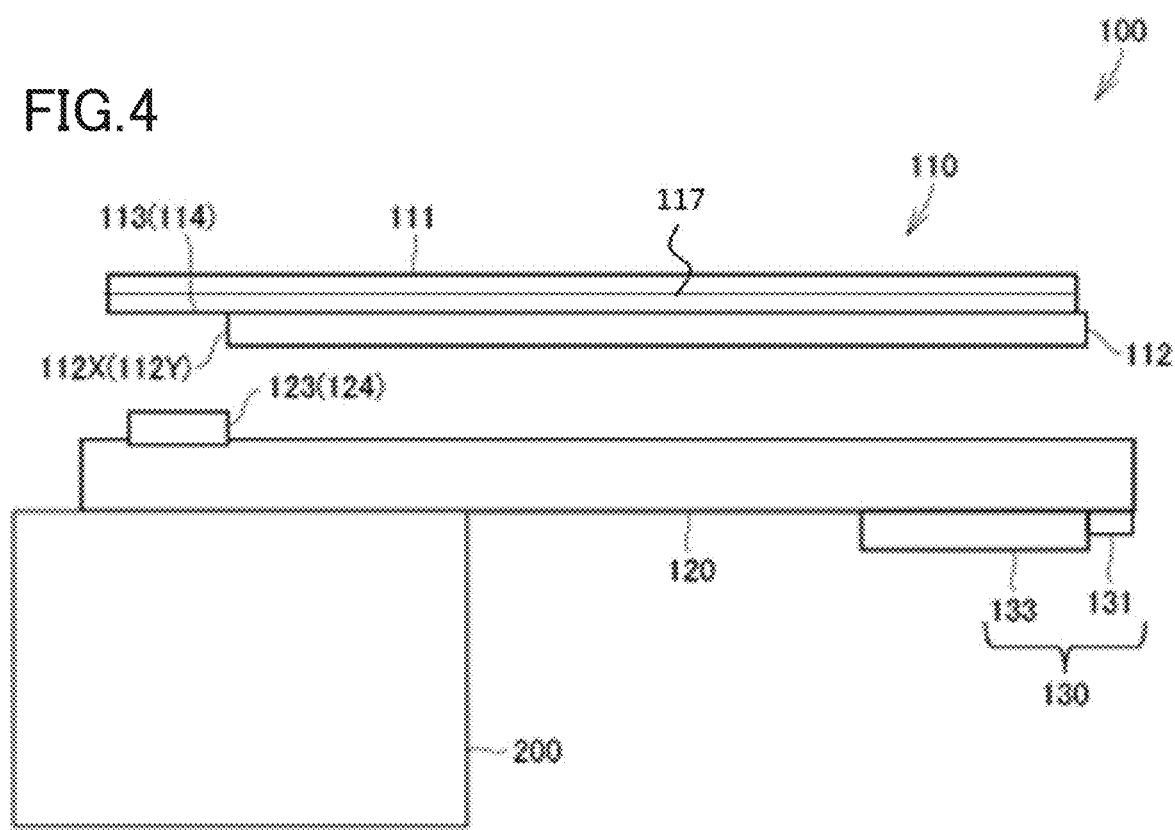
FIG. 4 is a diagram depicting one of the steps of manufacturing the solar battery unit 100 in accordance with the first embodiment, where the solar battery 110 is stacked on the substrate 120.
Figure 5:
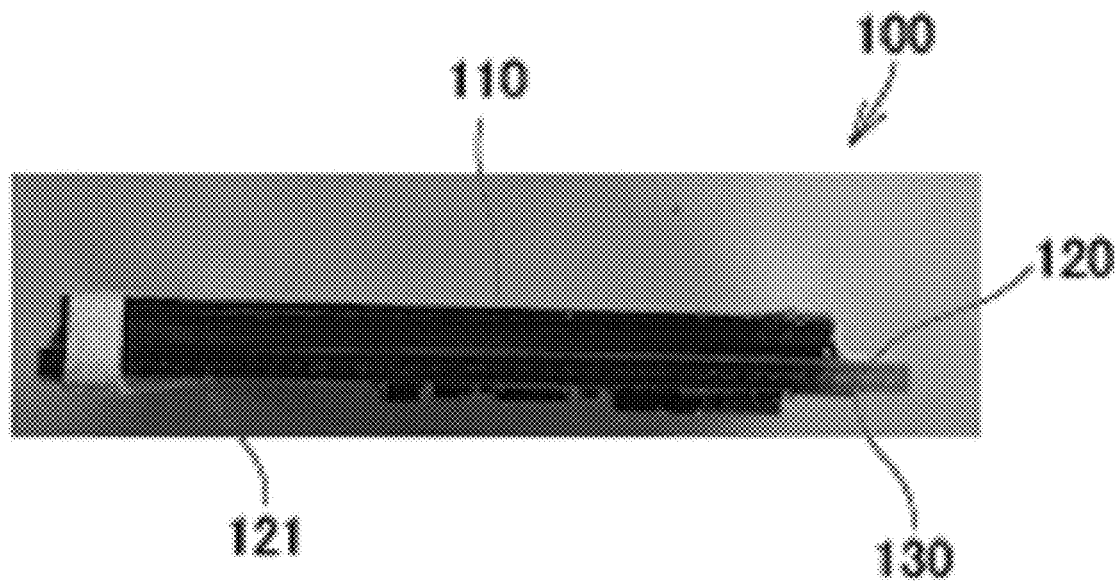
FIG. 5 is a photograph of a side face of the solar battery unit 100 in accordance with the first embodiment.

The flat area 121 does not need to be as flat as, for example, 1 µm or 1 nm and may be as irregular as less than $\frac{1}{10}$, more preferably less than $\frac{1}{20}$, the size of the substrate 120, for example, the distance A. This particular structure enables stable fixing of the substrate 120 when the substrate 120 is mounted on a flat base 200 with the flat area 121 facing down as shown in FIG. 4, thereby improving workability on the front face of the substrate 120.

More specifically, when the target area has large lumps and dents, it is only required that the lumps have the same level of surface height. When these conditions are met, the structure enables stable fixing of the substrate 120 when the substrate 120 is mounted on the flat base with the area facing down, thereby improving workability on the front face of the substrate 120.

Figure 6:
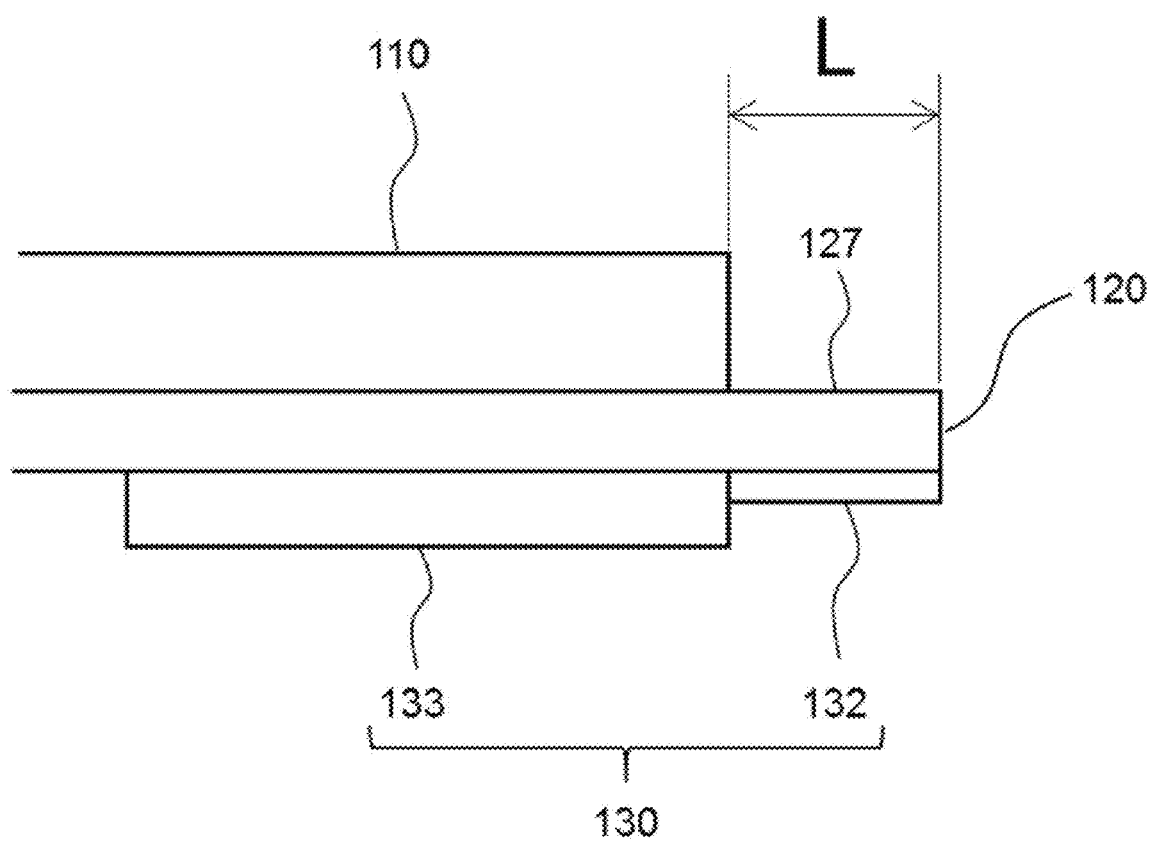
FIG. 6 is an enlarged photograph of an end portion of the side face of the solar battery unit 100 in accordance with the first embodiment, close to a communications module 130.

Additionally, in the present embodiment, the negative input terminal 123 and the positive input terminal 124 are located on the opposite side of the substrate 120 from the communications module 130 with respect to the Y-direction in FIG. 2. The solar cells 115 in the solar battery 110 are located on the substrate 120 close to the negative input terminal 123 and the positive input terminal 124 as shown in FIGS. 5 to 8. More specifically, the solar cells 115 in the solar battery 110 are located short of reaching the antenna 132 of the communications module 130. In other words, the antenna 132 of the communications module 130 is disposed on a non-conducting section 127 of the substrate 120 where the solar battery 110 does not reside. The non-conducting section 127 is an extension of the substrate 120 by a minimum distance of L outside the edge of the solar battery 110 as shown in FIG. 6. The communications antenna 132 is disposed on the back face of the extension of the substrate 120 outside the edge of the solar battery 110. No conductive member or material, except for the communications antenna 132, is preferably disposed in the non-conducting section 127 of the substrate 120 as shown in FIG. 8. This particular structure can alleviate the interference of the solar battery 110 with the communications performed by the communications module 130.

The solar battery 110 is electrically connected to the communications module 130 via conductive wiring (not shown) routed inside the substrate 120 from the negative input terminal 123 and the positive input terminal 124. In other words, the conductive wiring routed inside the substrate 120 from the negative input terminal 123 and the positive input terminal 124 is preferably not exposed in the flat area 121 on the back face of the substrate 120. The flat area 121 on the back face of the substrate 120 may be formed of a resin covering the conductive wiring.

The communications module 130 is rectangular in the present embodiment. The antenna 132 of the communications module 130 is elongate parallel to an edge of the substrate 120. In other words, the communications module 130 is mounted in such a manner that the antenna 132 is confined within the substrate 120, without extending beyond the substrate 120. This particular structure can prevent damage to the antenna 132 which has low stiffness.

The antenna 132 may entirely or partially extend parallel to an edge of the substrate 120 or extend along an edge of the substrate 120. In other words, the antenna 132 is preferably disposed so as to have the entire or partial length thereof parallel to an edge of the substrate 120.

Second Embodiment

Figure 9:
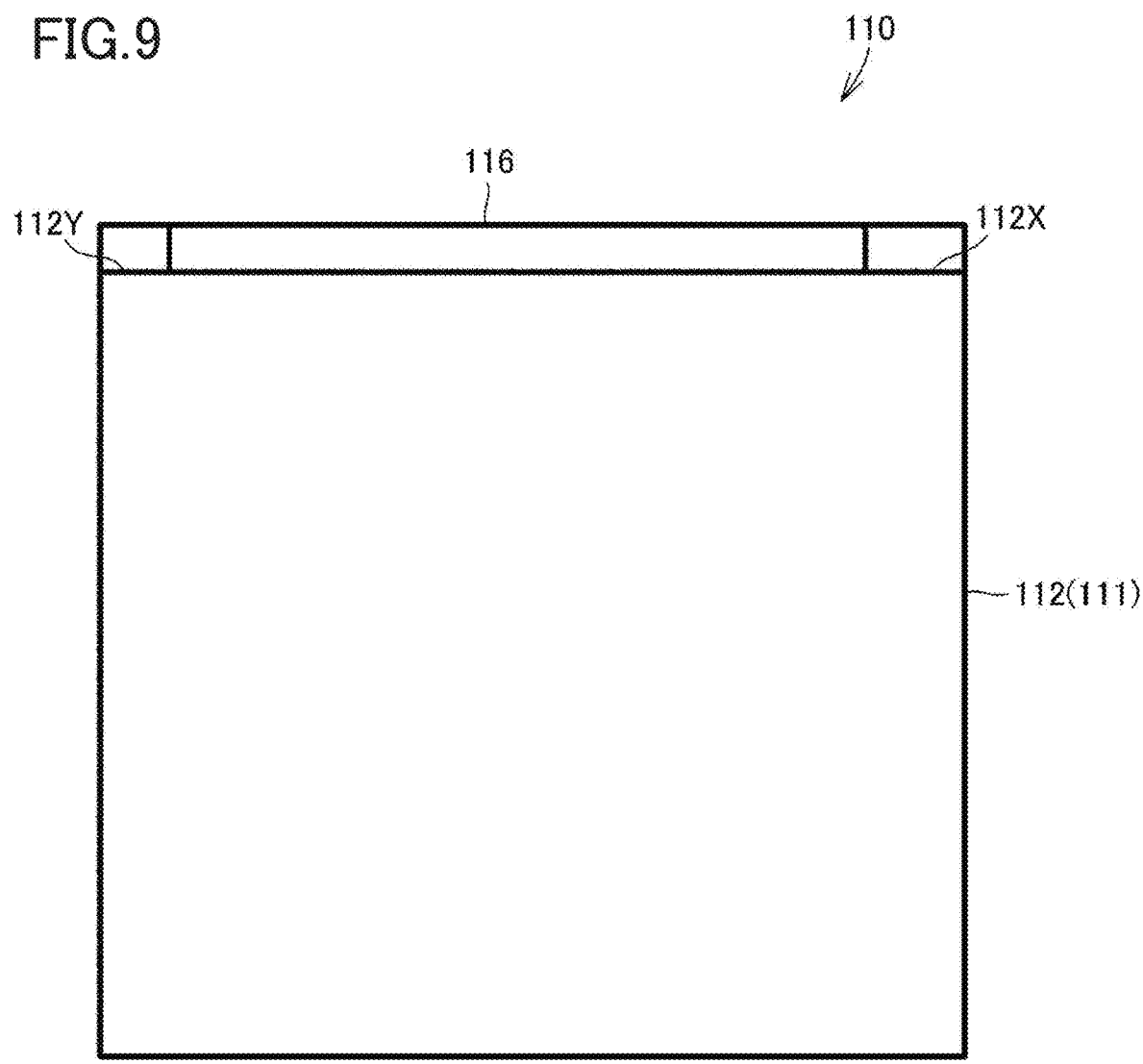
FIG. 9 is a backside view of a first glass substrate 111 and a second glass substrate 112 of the solar battery 110 in accordance with a second embodiment.
Figure 10:
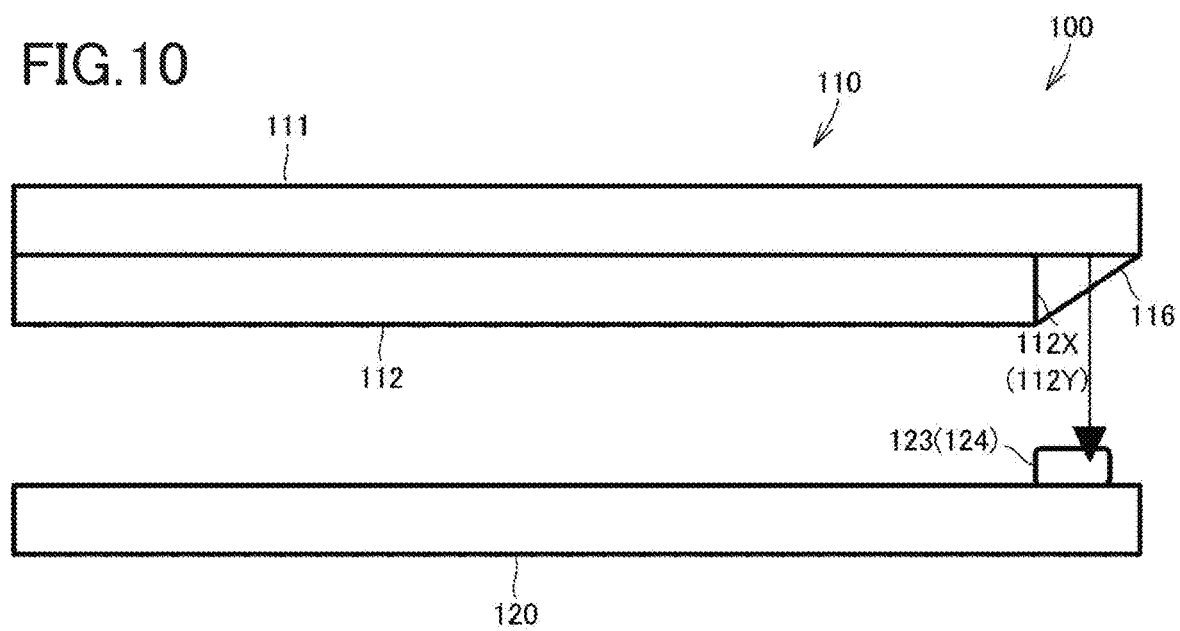
FIG. 10 is a side view of the first glass substrate 111, the second glass substrate 112, and the substrate 120 of the solar battery 110 in accordance with the second embodiment.

The second glass substrate 112, having the notches 112X and 112Y as described in the previous embodiment, may additionally have the entire remaining end portion thereof cut out. Specifically, as shown in FIGS. 9 and 10, the first glass substrate 111 and the second glass substrate 112 may be attached together in such a manner that the first glass substrate 111 has an edge jutting out of the edge of the second glass substrate 112.

More specifically, the solar battery unit 100 in accordance with the present embodiment is fabricated in the following manner. The first glass substrate 111 and the second glass substrate 112 are attached. An electrolytic solution is then injected between the first glass substrate 111 and the second glass substrate 112 through the site where the first glass substrate 111 and the second glass substrate 112 are offset as described above. Thereafter, an ultraviolet curing resin 116 is applied to the back face of the first glass substrate 111 and the side face of the second glass substrate 112 so as to close the injection port for the electrolytic solution. In doing so, the ultraviolet curing resin 116 is not applied to the notches 112X and 112Y.

When the ultraviolet curing resin 116 has cured, the front face of the ultraviolet curing resin 116 is carved off obliquely in such a manner that the ultraviolet curing resin 116 does not jut out of the front face of the second glass substrate 112 toward the substrate 120. This step forms a gap between the end portion of the solar battery 110 and the end portion of the substrate 120, rendering it easy to fit the input terminals 123 and 124 into the notches 112X and 112Y in the second glass substrate 112. The step hence improves workability in the assembly of the solar battery unit 100.

Third Embodiment

The preceding embodiments described the dye-sensitized solar cells 110. The embodiments are also applicable to other types of solar cells. Meanwhile, in the preceding embodiments, the communications module 130 is disposed on an end of the substrate 120 with respect to the length of the solar cells 115 in the solar battery 110, and the negative input terminal 123 and the positive input terminal 124 are disposed on the other end of the substrate 120 with respect to the length of the solar cells 115 in the solar battery 110. Alternatively, the communications module 130 may be disposed on an end of the substrate 120 with respect to the width of the solar cells 115 in the solar battery 110, and the negative input terminal 123 and the positive input terminal 124 may be disposed on the other end of the substrate 120 with respect to the width of the solar cells 115 in the solar battery 110.

Fourth Embodiment

Figure 11:
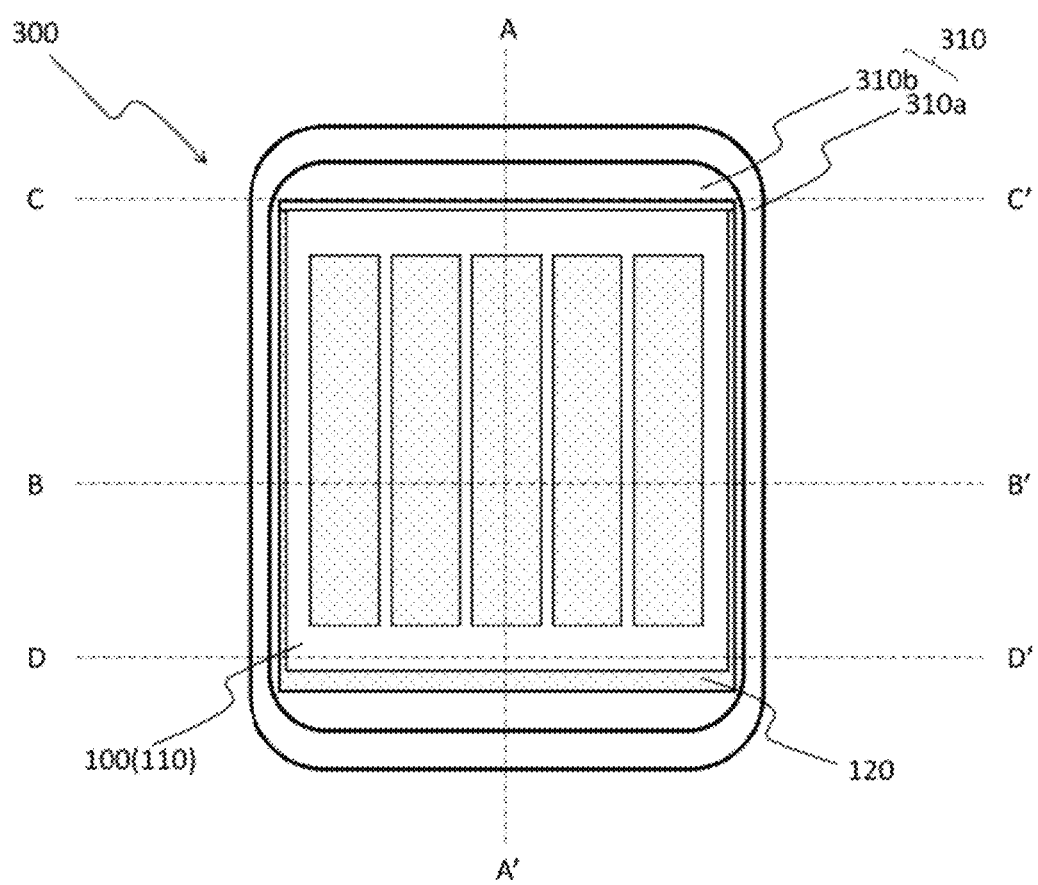
FIG. 11 is a front view of a wireless transmitter 300 in accordance with a fourth embodiment
Figure 12:
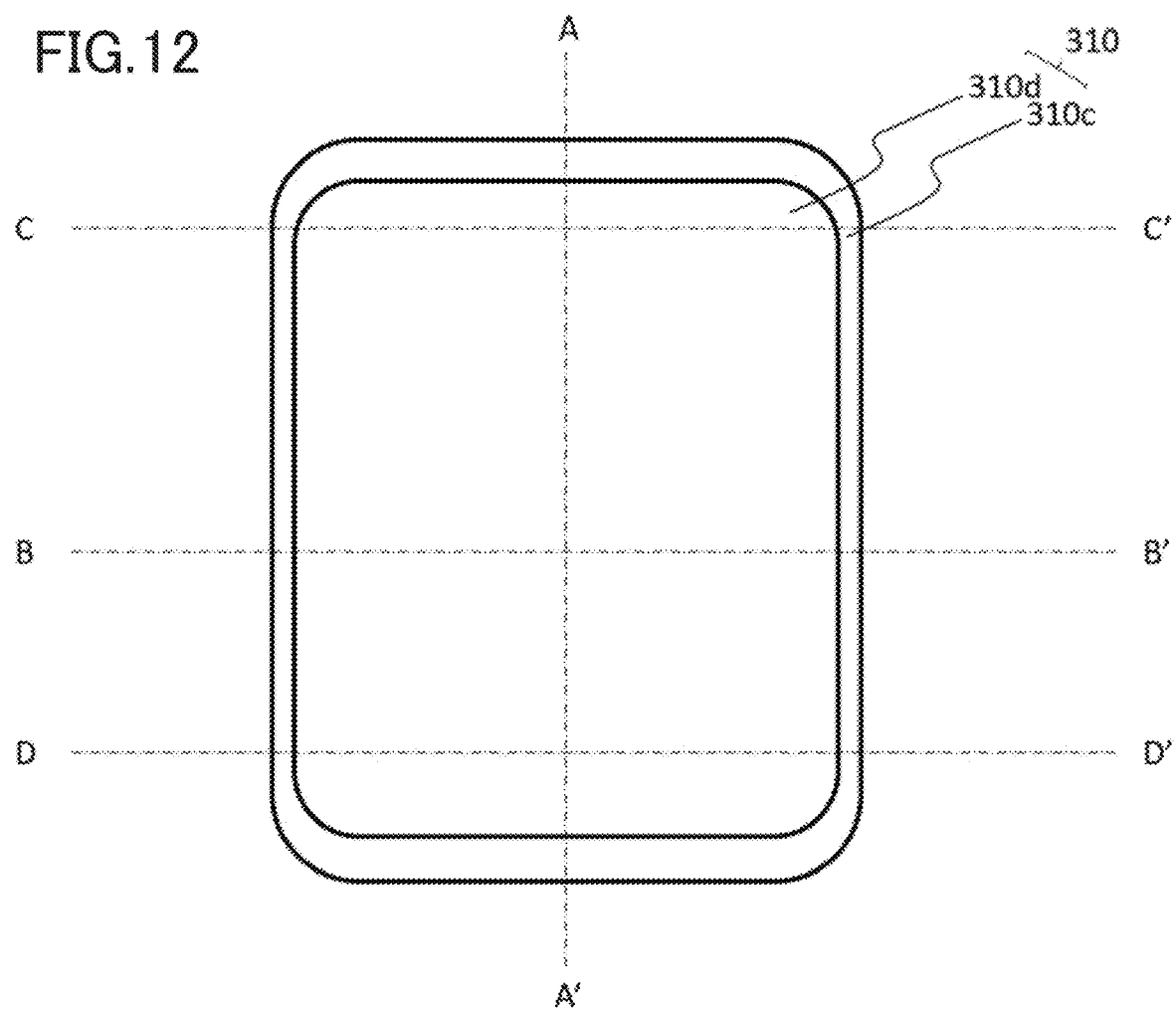
FIG. 12 is a rear view of the wireless transmitter 300 in accordance with the fourth embodiment.
Figure 13:
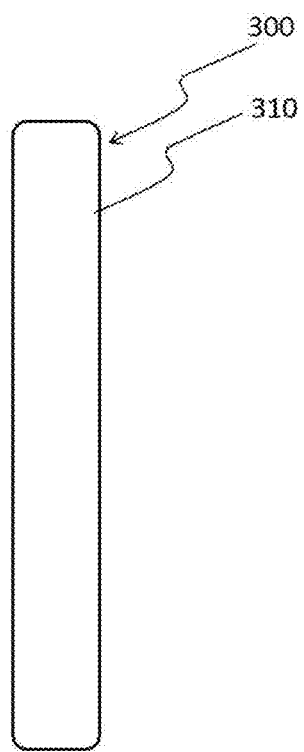
FIG. 13 is a side view of the wireless transmitter 300 in accordance with the fourth embodiment.
Figure 14:
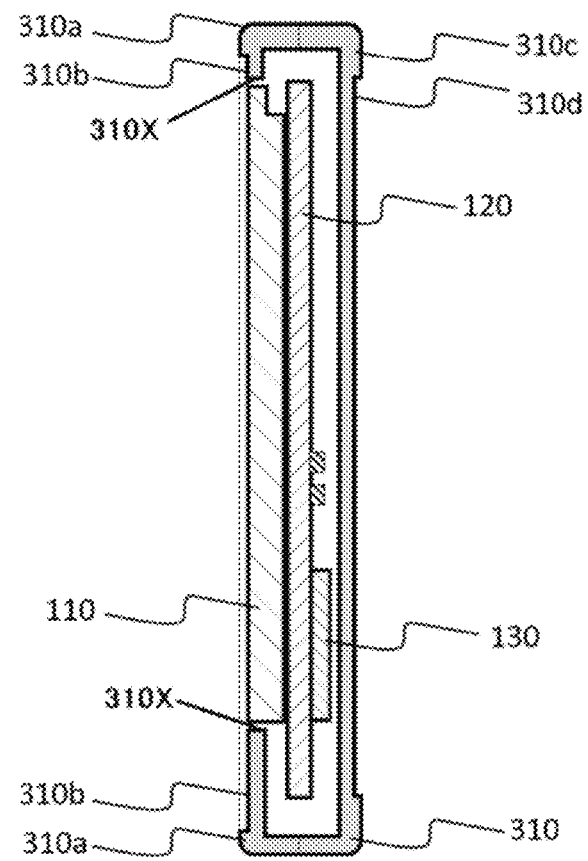
FIG. 14 is a cross-sectional view taken along line A-A' shown in FIG. 11.
Figure 15:
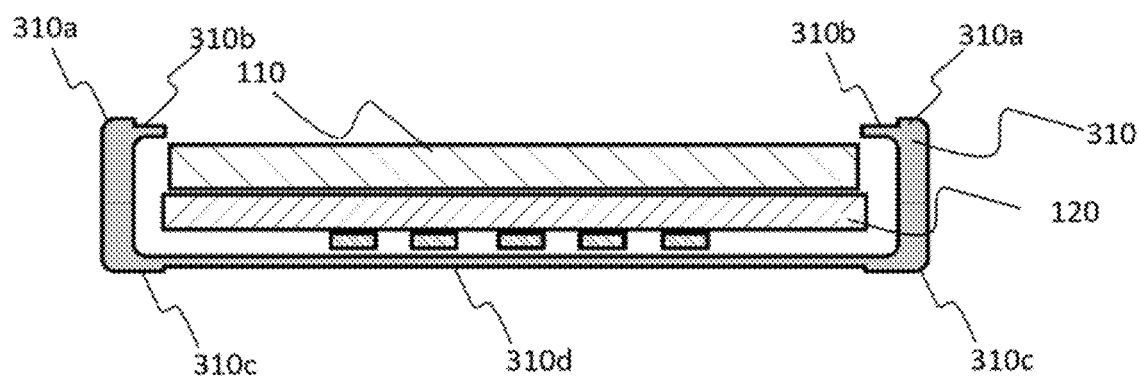
FIG. 15 is a cross-sectional view taken along line B-B' shown in FIG. 11.
Figure 16:
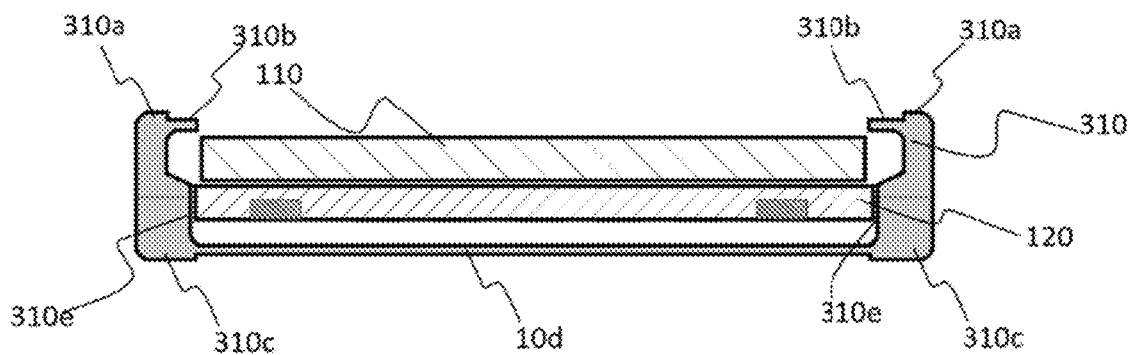
FIG. 16 is a cross-sectional view taken along line C-C' shown in FIG. 11.
Figure 17:
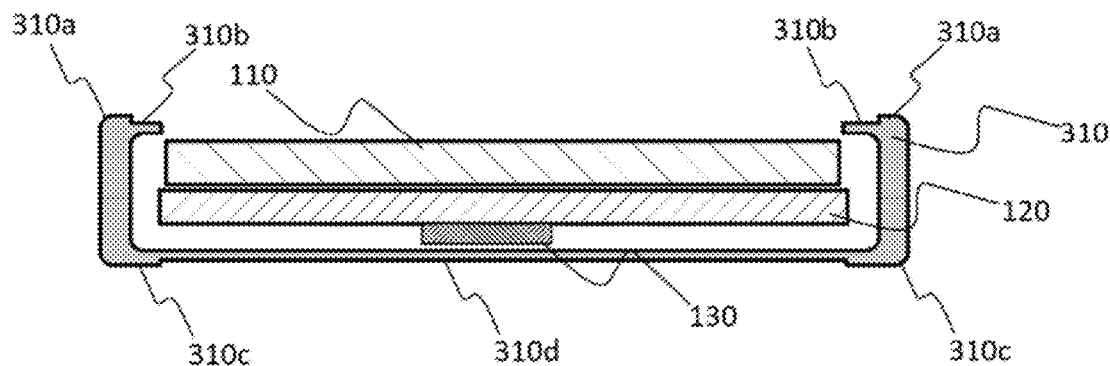
FIG. 17 is a cross-sectional view taken along line D-D' shown in FIG. 11.

A description is now given of the overall structure of a wireless transmitter 300 including a solar battery unit 100 in accordance with a fourth embodiment. FIG. 11 is a front view of the wireless transmitter 300 in accordance with the fourth embodiment. FIG. 12 is a rear view of the wireless transmitter 300 in accordance with the fourth embodiment. FIG. 13 is a side view of the wireless transmitter 300 in accordance with the fourth embodiment. FIG. 14 is a cross-sectional view taken along line A-A' shown in FIG. 11. FIG. 15 is a cross-sectional view taken along line B-B' shown in FIG. 11. FIG. 16 is a cross-sectional view taken along line C-C' shown in FIG. 11. FIG. 17 is a cross-sectional view taken along line D-D' shown in FIG. 11. Throughout the following description, the top or upward direction in FIG. 11 will be referred to as the top or upward direction for the wireless transmitter 300, the bottom or downward direction in FIG. 11 will be referred to as the bottom or downward direction for the wireless transmitter 300, the right or rightward direction in FIG. 11 will be referred to as the right or rightward direction for the wireless transmitter 300, the left or leftward direction in FIG. 11 will be referred to as the left or leftward direction for the wireless transmitter 300, the near side of the paper on which FIG. 11 is drawn will be referred to as the front of the wireless transmitter 300, and the far side of the paper on which FIG. 11 is drawn will be referred to as the back or rear of the wireless transmitter 300.

The wireless transmitter 300 in accordance with the present embodiment includes the solar battery unit 100 and a housing 310 covering a part of the solar battery unit 100. The solar battery unit 100 includes a solar battery 110 disposed in such a manner that the solar battery 110 can receive external light that comes in from outside the housing 310. The wireless transmitter 300 includes a mount (not shown) for attaching the wireless transmitter 300 onto, for example, a wall or ceiling when use.

In the present embodiment, the housing 310 is made of an elastic material, for example, a resin such as plastic or rubber in order to reduce the impact that the substrate 120 or the solar battery 110 receives when the wireless transmitter 300 falls from the wall to which the wireless transmitter 300 is attached.

In particular, the wireless transmitter 300 in accordance with the present embodiment is structured such that the housing 310 holds therein the solar battery 110 and the substrate 120 carrying the communications device 133 thereon and also that the solar cells 115 in the solar battery 110 are not covered by the housing 310 to facilitate reception of external light.

More specifically, the housing 310 includes a frontal component 310a and a rear component 310c. The frontal component 310a and the rear component 310c are interconnected, for example, by screws.

The frontal component 310a has an opening 310x where the solar battery 110 is to be located. The opening 310x, in a front view thereof, has an area that is preferably smaller than the area of the substrate 120 and larger than the area of the solar battery 110. Alternatively, the area of the opening 310x may be smaller than the area of the solar battery 110 and larger than the area where the solar cells 115 are located.

In the present embodiment, the substrate 120 and the side of the solar battery 110 facing the substrate 120 are brought into contact with the rear component 310c before the frontal component 310a and the rear component 310c are interconnected. The frontal component 310a and the rear component 310c are then interconnected, which results in the substrate 120 and the solar battery 110 being held between the frontal component 310a and the rear component 310c. In this situation, the substrate 120 is sandwiched on the left and right side faces thereof between internal left and right wall faces 310e of the housing 310 in the present embodiment.

In other words, the substrate 120 is held so as not to fall down in the housing 310, by being sandwiched by the housing 310 on the left and right sides thereof. In this condition, the solar battery 110 and the other parts of the substrate 120, among others, preferably do not come into contact with the housing 310. This particular structure can reduce the risk of the substrate 120 and the solar battery 110 being damaged in a collision with the housing 310 if the wireless transmitter 300 falls from, for example, the wall, pillar, or ceiling to which the wireless transmitter 300 is attached.

Even when the substrate 120 is sandwiched between the internal left and right wall faces 310e of the housing 310 on the left and right side faces thereof, the left and right side faces of the substrate 120 can preferably slide relative to the left and right wall faces 310e under such a force that the substrate 120 is not damaged. To enable the substrate 120 to slide, there is preferably a space between the top of the substrate 120 and an inner wall face of the housing 310 and between the bottom of the substrate 120 and an inner wall face of the housing 310, the directional terms being defined with reference to FIG. 11.

In the present embodiment, the substrate 120 is sandwiched on the left and right side faces thereof between the internal left and right wall faces 310e of the housing 310, to hold the substrate 120 in such a location that the top and bottom faces of the substrate 120 do not come into contact with the housing 310. In other words, there is provided a gap or space between the inner wall faces of the housing 310 and the faces of the substrate 120 except for the left and right side faces thereof. Alternatively, the substrate 120 may be also sandwiched on the top and bottom faces thereof between the inner wall faces of the housing 310. As another alternative, one or more sites on the substrate 120 other than the sites where the substrate 120 is sandwiched may be in direct or indirect contact with, or directly or indirectly held by, the inner wall faces of the housing 310.

The substrate 120 is held by the housing 310 with the most forward part of the solar battery 110 residing behind the most forward part of the housing 310. In other words, the solar battery 110 is preferably held by the housing 310 with the solar battery 110 receding inside the housing 310. This particular structure can reduce the risk of the solar battery 110 coming into contact with, for example, the floor surface when the front side of the housing 310 comes into contact with the floor surface.

Furthermore, in the present embodiment, the frontal component 31a of the housing 310 has indented rearward an internal side portion thereof, that is, an end portion 31b thereof close to the opening 310x. In other words, the housing 310 has an edge portion residing close to the opening 310x and projecting toward the center of the opening 310x. This particular structure can reduce the risk of the solar battery 110 coming into contact with external objects.

The rear component 31c of the housing 310 has a central portion 31od thereof that is thinner than the portion surrounding the central portion 310d when viewed in a front or rear view thereof.

Furthermore, in the present embodiment, the antenna 132 is preferably located close to the bottom end (first end) of the substrate 120 with respect to the up/down direction (second direction) that crosses at right angles the left/right direction (first direction), the directional terms being defined with reference to FIG. 11. Letting W represent the length of the substrate 120 as measured in the up/down direction (second direction), the antenna 132 is preferably located between the bottom end (first end) of the substrate 120 and a location one third of the length W up from the bottom end, the directional terms being defined with reference to FIG. 1. The antenna 132 is more preferably located along the bottom end (first end) of the substrate 120. The antenna 132, when located closer to the bottom end (first end), better restrains the solar battery 110 attached to the front face of the substrate 120 from attenuating the strength of the signal transmitted from the antenna 132.

Furthermore, in the present embodiment, those sites on the side faces of the substrate 120 where the substrate 120 is sandwiched by the left and right side faces 310e are preferably located close to the top end (second end) of the substrate 120 as shown in FIG. 11. Those sites on the left and right side faces of the substrate 120 where the substrate 120 is sandwiched are preferably located between the top end (second end) of the substrate 120 and a location half the length W down from the top end and more preferably located between the top end and a location one third of the length W down from the top end.

Fifth Embodiment

Figure 18:
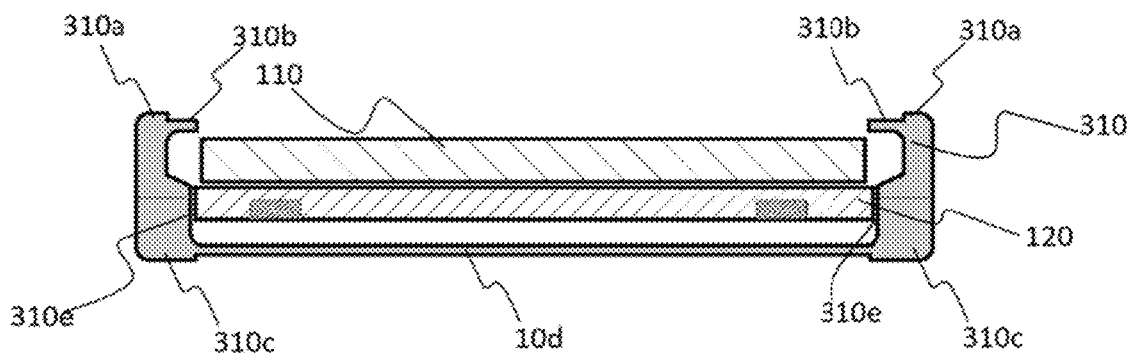
FIG. 18 is a cross-sectional view of a wireless transmitter 300 in accordance with a fifth embodiment, taken along line B-B'.

In addition to the structure of any one of the preceding embodiments, there may be provided an elastic member 312 between the substrate 120 and the housing 310 as shown in FIG. 18, the elastic member 312 being softer than the substance for the housing 310. This particular structure can further reduce the impact that the substrate 120 or the solar battery 110 receives when the wireless transmitter 300 falls off. The elastic member 312 is not necessarily disposed on the rear face of the substrate 120 and may alternatively disposed, for example, between the inner wall face of the housing 310 and, for example, a bottom, top, or side face of the substrate 120 or the solar battery 110.

Sixth Embodiment

Figure 19:
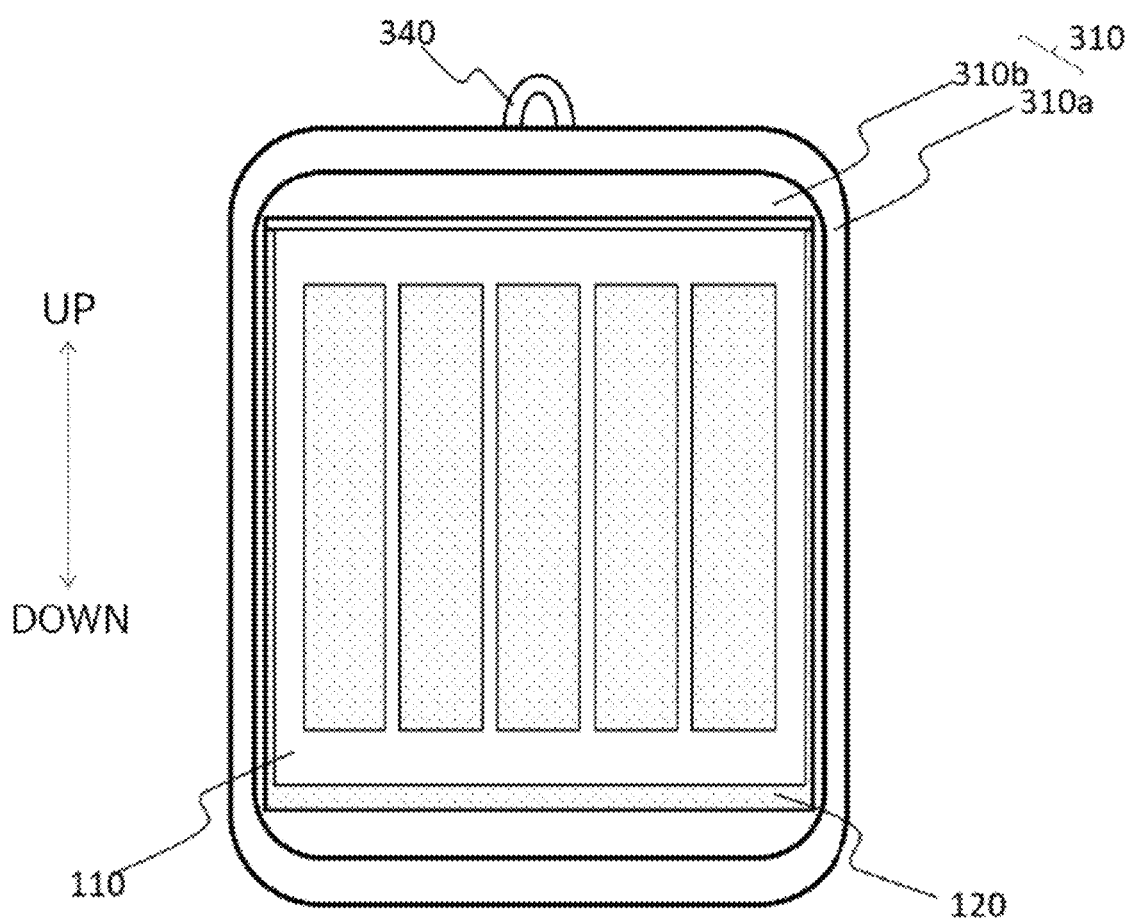
FIG. 19 is a front view of a wireless transmitter 300 in accordance with a sixth embodiment.

In addition to the structure of any one of the preceding embodiments, there is preferably provided a wall-face-attaching section on the top end of the housing 310 as shown in FIG. 19. This particular structure facilitates attaching of the housing 310 to a projection on a wall or pillar.

More preferably, the housing 310 sandwiches the substrate 120 and the solar battery 110 in such a manner that the end of the substrate 120 where the antenna 132 resides is located closer to the bottom. In other words, a wall-face-attaching section 340 is preferably provided on one of the end portions of the housing 310 that is farther from the antenna 132 than is the other end portion thereof.

Seventh Embodiment

Figure 20:
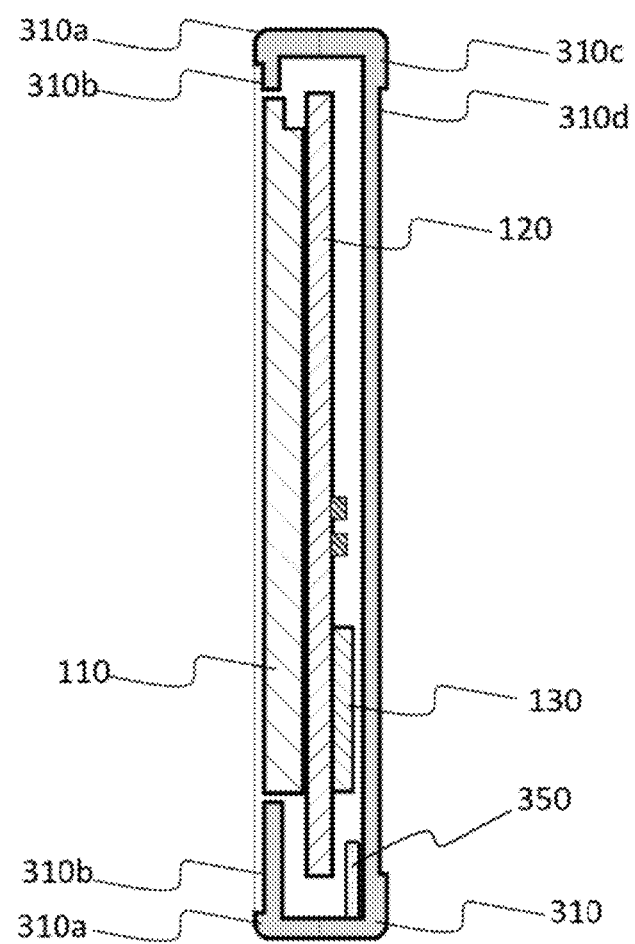
FIG. 20 is a cross-sectional view of a wireless transmitter 300 in accordance with a seventh embodiment, taken along line A-A'.

In addition to the structure of any one of the preceding embodiments, there is attached a center-of-gravity adjusting section 350, that is, a weight, to the rear interior of the housing 310 as shown in FIG. 20. More specifically, the center-of-gravity adjusting section 350 preferably weighs from one third to 1.5 times the sum weight of the substrate 120 and the solar battery 110.

Figure 21:
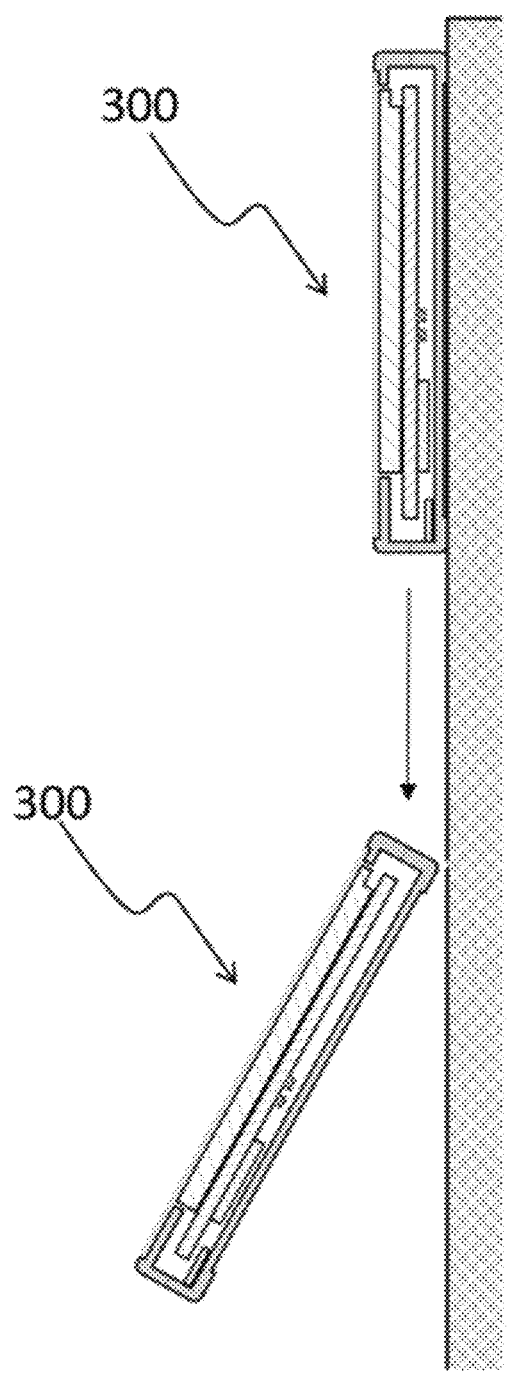
FIG. 21 is an imaginary image of a position of the wireless transmitter 300 in accordance with the seventh embodiment in a fall.

This particular structure can reduce the risk of the front face of the solar battery 110 coming into contact with the floor surface because the rear face of the housing 310 will likely face downward when the wireless transmitter 300 falls off, as shown in FIG. 21.

The center-of-gravity adjusting section 350 is not necessarily located inside the housing 310 and may be located near the rear exterior of the housing 310.

The center-of-gravity adjusting section 350 may be provided either on a part of the bottom face of the housing 310, across the entire bottom face of the housing 310, or all along the periphery of the bottom face of the housing 310.

Eighth Embodiment

The housing 310, in the preceding embodiments, is so structured that the frontal component 310a and the rear component 310c can be bent relative to each other. The frontal component 310a and the rear component 310c may be coupled in such a manner that either the right portion of the frontal component 310a and the left portion of the rear component 310c are pivotable, the left portion of the frontal component 310a and the right portion of the rear component 310c are pivotable, the top portion of the frontal component 310a and the top portion of the rear component 310c are pivotable, or the bottom portion of the frontal component 310a and the bottom portion of the rear component 310c are pivotable.

Alternatively, the frontal component 310a and the rear component 310c may be attached together from the front. The frontal component 310a and the rear component 310c may be either attached together in a detachable manner or firmly attached together, for example, using an adhesive.

Ninth Embodiment

Figure 22:
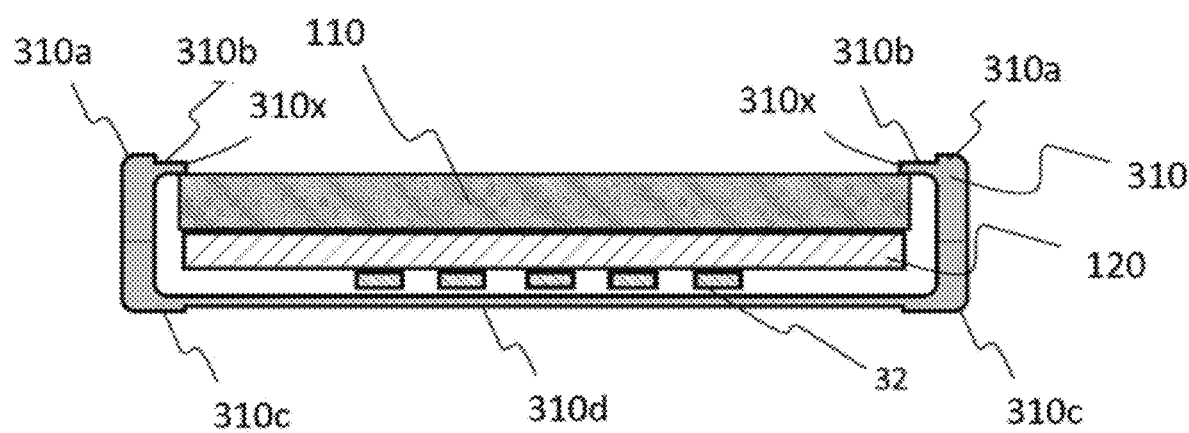
FIG. 22 is a cross-sectional view of a wireless transmitter 300 in accordance with a ninth embodiment, taken along line B-B'.

In addition to the structure of any one of the preceding embodiments, the end portion 310b of the housing 310, located close to an opening 301x, may cover an edge of the solar battery 110 as shown in FIG. 22. In other words, the opening 310x of the housing 310 has an area smaller than the area of the substrate in the solar battery 110. This structure can prevent powder and dust from undesirably entering the housing 310 through the opening 310x.

CROSS-REFERENCE TO RELATED APPLICATIONS

The present application claims priority to Japanese Patent Application, Tokugan, No. 2018-138848 filed Jul. 24, 2018, Japanese Patent Application, Tokugan, No. 2018-138849 filed Jul. 24, 2018, and Japanese Patent Application, Tokugan, No. 2018-138850 filed Jul. 24, 2018, each of which is incorporated herein by reference in its entirety.

The invention claimed is:

1. A wireless transmitter comprising a solar battery unit, wherein
the solar battery unit comprises:
a substrate;
a solar battery including a solar cell attached to a major face of the substrate;
a first input terminal and a second input terminal on the major face of the substrate; and
an antenna and a communication device attached to an opposite face of the substrate from the major face, the antenna being disposed so as not to overlap the solar cell in the solar battery in a front view,
the solar battery including:
a first transparent substrate serving as a light-receiving face;
a second transparent substrate stacked on a front face of the first transparent substrate, the second transparent substrate facing the first transparent substrate; and
a transparent conductive film on a second transparent substrate side of the first transparent substrate,
wherein the second transparent substrate has notches exposing a portion of the transparent conductive film, and
the transparent conductive film contacts the first input terminal and the second input terminal of the substrate in the exposed portion of the transparent conductive film.

2. The wireless transmitter according to claim 1, further comprising a housing containing therein the solar battery unit, wherein
the housing sandwiches the substrate on parts of side faces thereof,
the antenna is positioned lower with respect to a vertical direction than sites at which the housing sandwiches the substrate on the side faces, where a horizontal direction is a direction in which the housing sandwiches the substrate on the parts of the side faces thereof, and the vertical direction is perpendicular to the horizontal direction, and
the wireless transmitter has an empty space between one of the side faces of the substrate and an inner wall of the housing.

3. The wireless transmitter according to claim 1, further comprising a housing containing therein the solar battery unit, wherein
the housing sandwiches the substrate on parts of side faces thereof,
the antenna is disposed on a first end side of the substrate with respect to a second direction, where a first direction is a direction in which the housing sandwiches the substrate on the parts of the side faces thereof, and the second direction is perpendicular to the first direction,
the housing sandwiches the substrate on the side faces at sites that are closer to a second end of the substrate than to the antenna, the second end residing opposite a first end across the substrate, and
the wireless transmitter has an empty space between one of the side faces of the substrate and an inner wall of the housing.

4. The wireless transmitter according to claim 3, wherein
the substrate is substantially rectangular, and
the antenna is located between the first end and a location one third of W up from the first end, where W is a length of the substrate in the second direction.

5. The wireless transmitter according to claim 3, wherein
the substrate is substantially rectangular, and
the housing sandwiches the substrate at sites located between the second end and a location half of W down from the second end, where W is a length of the substrate in the second direction.

6. The wireless transmitter according to claim 2, wherein the side faces of the substrate where the housing sandwiches the substrate are slidable.

7. The wireless transmitter according to claim 2, wherein
the housing has an opening in which the light-receiving face of the solar battery is exposed, and
the opening has an opening area that is larger than a light-receiving area of the light-receiving face of the solar battery and smaller than an area of the substrate.

8. The wireless transmitter according to claim 3, wherein the side faces of the substrate where the housing sandwiches the substrate are slidable.

9. The wireless transmitter according to claim 3, wherein
the housing has an opening in which the light-receiving face of the solar battery is exposed, and the opening has an opening area that is larger than a light-receiving area of the light-receiving face of the solar battery and smaller than an area of the substrate.

10. The wireless transmitter according to claim 1, wherein the solar battery supplies electric power to the communication device via the transparent conductive film.

11. The wireless transmitter according to claim 1, wherein the first input terminal and the second input terminal are provided on an opposite side of the substrate from the antenna.

12. The wireless transmitter according to claim 1, wherein the antenna is elongate parallel to an edge of the substrate.

13. The wireless transmitter according to claim 1, wherein the antenna is disposed at an end of the substrate, and no conductive material, except for the antenna, is disposed in a location where the end of the substrate with the antenna does not overlap the solar cell in a top view.

14. The wireless transmitter according to claim 1, wherein a dye-sensitized solar cell generates electric power from the light of indoor lights as the solar battery and the communication device regularly emits radio beacons by using the electric power.

15. The wireless transmitter according to claim 1, wherein the second transparent substrate is attached to the first transparent substrate with an offset portion to form the notches in the second transparent substrate.

16. The wireless transmitter according to claim 15, wherein a resin is provided in the offset portion except for the transparent conductive film.

17. The wireless transmitter according to claim 1, wherein an electrolytic solution is injected between the first transparent substrate and the second transparent substrate.

18. The wireless transmitter according to claim 1, wherein the housing is an elastic body.

19. The wireless transmitter according to claim 2, wherein an elastic body softer than a material of the housing is disposed between the substrate and the housing.

20. The wireless transmitter according to claim 2, wherein the housing has a top end with a wall-face-attaching section, and includes a center-of-gravity adjusting section so that a rear face of the housing opposite the solar battery is biased to face downward when the wireless transmitter falls off from a wall face.

* * * * *